United States Patent
Zaloga et al.

(10) Patent No.: US 6,369,345 B1
(45) Date of Patent: Apr. 9, 2002

(54) METHOD AND APPARATUS FOR REFLOWING SOLDER PASTE USING A LIGHT SOURCE

(75) Inventors: Andrew W. Zaloga, Chandler; Carolyn M. Stokman, Phoenix; Jeffery J. Kokovitch, Gilbert, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/641,665

(22) Filed: Aug. 18, 2000

(51) Int. Cl.$^7$ .......................... B23K 1/005; B23K 31/02
(52) U.S. Cl. ................ 219/85.13; 228/179.1; 228/248.1
(58) Field of Search .............. 228/248.1, 248.5, 228/179.1; 219/85.12, 85.13

(56) References Cited

U.S. PATENT DOCUMENTS

| | | | |
|---|---|---|---|
| 3,592,992 A | * | 7/1971 | Costello |
| 3,717,742 A | * | 2/1973 | Fottler |
| 4,697,061 A | * | 9/1987 | Spater et al. |
| 5,484,979 A | * | 1/1996 | Gao |
| 5,509,597 A | * | 4/1996 | Laferriere |
| 5,551,628 A | * | 9/1996 | Van Gerven et al. |
| 5,574,629 A | * | 11/1996 | Sullivan |
| 5,899,737 A | * | 5/1999 | Trabucco |
| 5,964,395 A | * | 10/1999 | Glovatsky et al. |
| 6,041,994 A | * | 3/2000 | Hwang et al. |
| 6,043,454 A | * | 3/2000 | Sheffer |
| 6,053,398 A | * | 4/2000 | Iizuka et al. |
| 6,168,070 B1 | * | 1/2001 | Sinkunas |
| 6,173,887 B1 | * | 1/2001 | Mead et al. |
| 6,234,374 B1 | * | 5/2001 | Hwang et al. |

* cited by examiner

Primary Examiner—Tom Dunn
Assistant Examiner—Kiley Stoner
(74) Attorney, Agent, or Firm—Frank J. Bogacz

(57) ABSTRACT

A method and apparatus for coupling a microelectronic component (114) to a printed circuit board (112) are disclosed. The component (114) is coupled to the circuit board (112) by placing leads (116) of component (114) in contact with conducting pads (118) on the circuit board (120), dispensing a bead of solder paste (110) onto the leads (116), and applying heat to the applied paste (110) to cause the solder to reflow. The solder bead is dispensed using a solder paste dispenser (108) and heated using a light source (102).

3 Claims, 1 Drawing Sheet

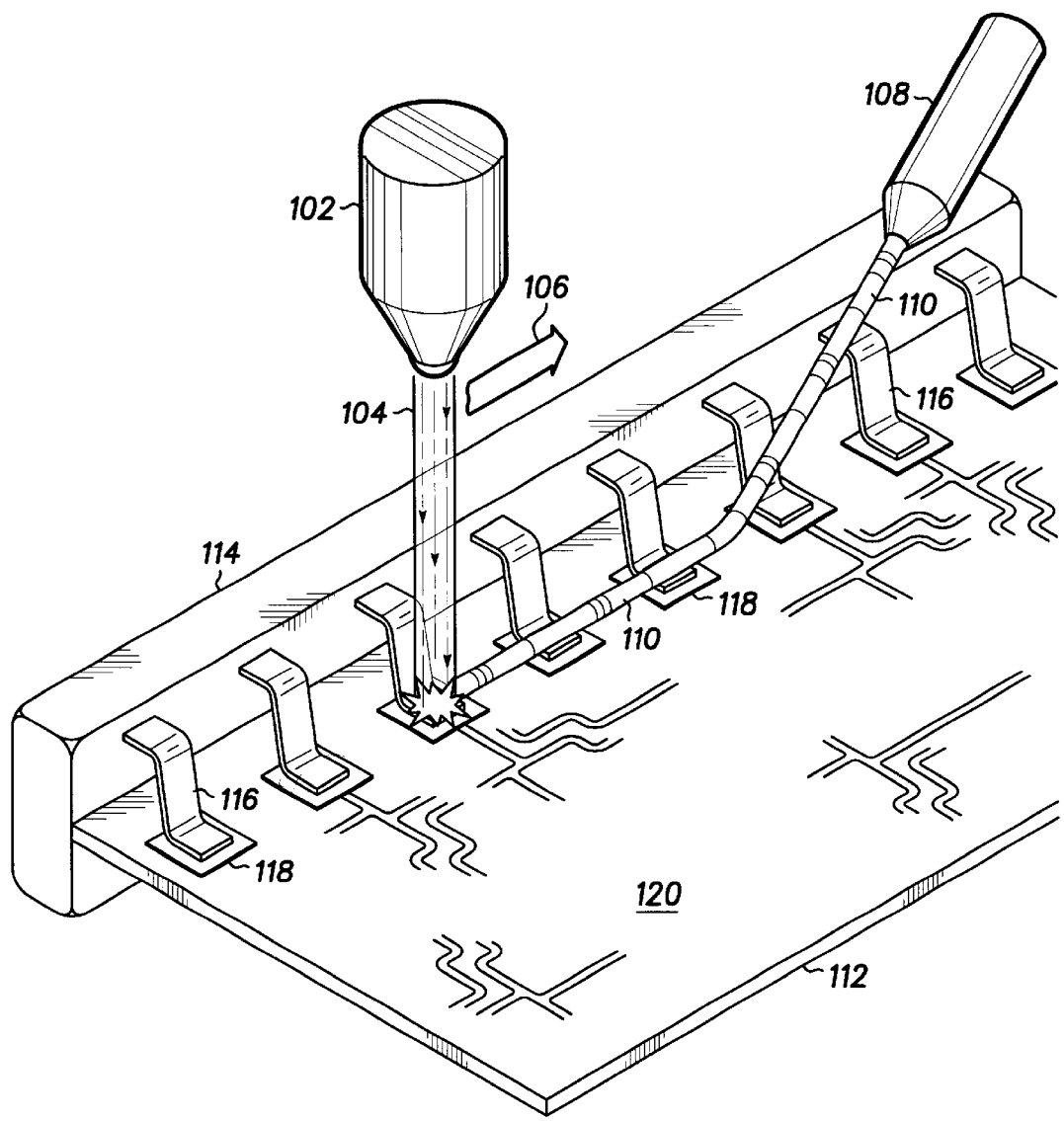

METHOD AND APPARATUS FOR REFLOWING SOLDER PASTE USING A LIGHT SOURCE

BACKGROUND OF THE INVENTION

1. Technical Field

The present invention relates, generally, to methods and apparatus for reflowing solder paste using a light source and, more particularly, to a movable head having a solder paste dispenser and a heat lamp mounted thereto for simultaneously applying a bead of solder paste to the leads of a microelectronic component mounted on a printed wiring board and heating the applied solder paste.

2. Background Art and Technical Problems

Presently known techniques for soldering high pin count, fine pitch surface mounted connectors to corresponding electrically conductive pads on a printed circuit board involve the use of hot bar soldering, focused light beam soldering using solder wire, hand soldering, and pre-soldered component soldering. While presently known soldering techniques generally provide good electrical contact between the component leads and the circuit board, these techniques are time consuming and cumbersome which tend to limit throughput.

Other known soldering techniques employ a stencil having cutouts located at the contacts of the printed circuit board, with the stencil being overlaid on to the circuit board. A dollop of solder paste is then applied to the stencil at one end of the circuit board, and thereafter, "squeegeed" to ensure that solder paste is applied to all of the electrical contacts (also referred to herein as "pads") to the cutouts in the stencil. After the stencil is removed, solder paste covers all of the contacts on the circuit board. The microelectronic components are then placed on the circuit board with the leads extending from the components placed in contact with the pre-soldered pads on the circuit board. Again, this technique is time consuming and cumbersome, and can result in electrical short circuits due to imprecise application of the solder, misalignment of the component parts on the circuit board, and the like.

BRIEF DESCRIPTION OF THE DRAWING

The present invention will hereinafter be described in conjunction with the appended drawing figure, wherein the drawing figure is a schematic perspective diagram illustrating a printed wiring board and a microelectronic component having leads extending therefrom in contact with corresponding paths on the wiring board, and further illustrating a light source and a solder paste dispenser configured to be moved over the leads.

DETAILED DESCRIPTION OF THE DRAWINGS

Referring now to the drawing figure, a light source 102 and a solder paste dispenser 108 are suitably mounted to a movable head (the movable head is omitted from the drawing figure for clarity). In a preferred embodiment of the present invention, a Panasonic model no. YB-04FH1 softbeam spot solder machine was retrofitted to configure it for use with the present invention. In accordance with the particularly preferred embodiment, the soldering system includes a light beam heating system, model no. YB-02AC2 and an industrial robot model no. YB-04FJ1 for soldiering the microelectronic components onto the wiring board, all available from Panasonic Corporation. In particular, the solder wire dispenser of the machine was removed and replaced with a solder paste dispenser. Although the above machinery was used other manufacturers' equipment and model may equally well be used to embody the present invention.

With continued reference to the drawing figure, a connector 114 is mounted to a printed wiring board 112 in accordance with the present invention. In this context, printed wiring board 112 is also referred to as a printed circuit board.

Connector 114 may comprise virtually any desired microelectronic component such as an integrated circuit chip. Connector 114 includes a plurality of electrically conductive leads 116 extending therefrom. Wiring board 112 includes a mounting surface 120, comprising a plurality of electrical contacts 118, referred to as "pads." In one embodiment of the present invention, connector 114 is connected to wiring board 112 in a straddle mount configuration, in which a first series of leads 116 are connected to top surface 120, and a second set of leads (not shown) are similarly connected to a similar pattern of pads on the bottom surface (not shown) of wiring board 112. In an alternate embodiment, connector 114 may be surface mounted to surface 120 of wiring board 112 wherein a plurality of leads 116 extend from 1, 2, 3, or 4 sides of connector 114.

The manner in which connector 114 is soldered to wiring board 112 in accordance with the present invention will now be described.

In contrast to prior art techniques wherein solder is applied to the pads on a wiring board before the microelectronic component is placed on the wiring board, in the present invention connector 114 is placed on wiring board 112 before the solder is applied. In particular, connector 114 is placed on wiring board 112 such that each of the leads 116 extending from connector 114 are placed in contact with a respective one of pads 118. Once leads 116 are aligned with pads 118, a bead 110 of solder paste is applied to leads 116 in the vicinity of the pads 118. As described in greater detail below, bead 110 is thereafter heated to reflow the solder paste.

In an exemplary application of the present invention, the length of each pad 118 is suitably on the order of 0.110 inches, and the width of each pad 118 is on the order of 0.016 inches. The soldering techniques of the present invention are particularly well suited for use with high-pin count, fine pitch microelectronic components, for example, components having leads with a pitch on the order of 0.025 inches.

In accordance with one aspect of the present invention, a continuous bead of solder paste 110 is applied across leads 116. Consequently, solder paste is not only applied at each respective pad 118, but also to the spaces on wiring board 112 between each of pads 118.

Solder paste bead 110 may be conveniently applied to leads 116 by passing a moving head (not shown) over leads 116 with solder paste dispenser 108 and light source 102 being mounted to the heads such that the light beam 104 emitted by light source 102 heats solder paste bead 110 as bead 110 is applied to the leads 116 or immediately thereafter. In a preferred embodiment, light source 102 comprises a Xenon bulb, and a fiber optic cable (not shown) may be employed to direct beam 104 at leads 116.

In accordance with a further aspect of the present invention, a suitable solder paste is part no. RMA376EH, which suitably comprises 62% tin, 36% lead, and 2% silver. This solder paste is available from Alpha Metals Soldercreams of Jersey City, N.J. It will be appreciated, however, that any solder paste may be employed which is dispensable and reflowable. Solder paste dispenser 108 may comprise any suitable device, for example, a syringe, capable of dispensing a metered bead of solder paste; in exemplary embodiment, a bead in the range of 0.015 inches in diameter is dispensed onto leads 116 as the moving head passes over leads 116. In accordance with a further aspect of the present invention, light beam 104 suitably exhibits a foot print in the range of 0.100 inches, and travels across the leads 116 at speeds ranging from 1 to 10 inches per second, and preferably at 3 to 4 inches per second. Light source 102 should thus be configured to apply light energy to leads 116 of sufficient intensity to reflow the solder paste. In this regard, a solder paste should be selected which adheres to itself and which adheres to leads 116 and pads 118, but which does not adhere to surface 120. Thus, as light source 102 passes over bead 110, the solder paste agglomerates onto pads 118, for example, in a substantially spherical configuration. In a liquefied or reflow state, the solder paste will tend to remain only on conductive pads 118 and leads 116 and will drawn away from and off of the interstitial spaces of surface 120 between pads 118.

Although the present invention has been described in connection with the drawing figure, it will be appreciated that the scope of the invention is not limited to the embodiments described herein. For example, although light source 102 has been described as a Xenon bulb, it will be appreciated that virtually any contactless heating source may be employed to reflow the solder paste. Moreover, although solder paste dispenser 108 has been described herein as a syringe, any suitable device for metering a predetermined amount of solder paste may be employed. Furthermore, although the invention has been described in the context of a Panasonic soft-beam soldering system, virtually any apparatus may be employed which conveniently moves a solder paste dispenser and a heating source over leads 116. These and other modifications may be made in the design and implementation of the present invention without departing from the spirit and scope of the invention as set forth in the appended claims.

What is claimed is:

1. The method of soldering a microelectronic component having a plurality of leads extending therefrom to corresponding electronically conductive pads on a printed wiring board, the method comprising the steps of:

placing said microelectronic component on said printed wiring board such that each of said plurality of leads is in contact with a respective one of said corresponding electronically conductive pads;

applying a continuous bead of solder paste over said plurality of leads in a vicinity of said corresponding electronically conductive pads;

passing a noncontacting heat source over said plurality of leads to thereby reflow said continuous bead of solder paste;

mounting a solder paste dispenser and a light source to a movable head;

moving said movable head over said plurality of leads to apply said continuous bead of solder paste to said plurality of leads; and simultaneously heating that portion of said plurality of leads to which said continuous bead of solder paste has been applied.

2. The method of claim 1, wherein said noncontacting heat source comprises a Xenon bulb and a fiber optic cable for transmitting energy emitted by said Xenon bulb to said plurality of leads.

3. The method of claim 2, wherein said step of passing a noncontacting heat source over said plurality of leads comprises moving said movable head relative to said plurality of leads at a rate in a range of four inches per second to thereby liquefy said continuous bead of solder paste.

* * * * *